United States Patent [19]

Mochizuki et al.

[11] Patent Number: 5,089,790
[45] Date of Patent: Feb. 18, 1992

[54] FIELD EFFECT TRANSISTOR AMPLIFIER

[75] Inventors: Mitsuru Mochizuki; Youji Isota; Tadashi Takagi; Shuji Urasaki, all of Kamakura, Japan

[73] Assignee: Mitsubishi Denki Kabushiki Kaisha, Tokyo, Japan

[21] Appl. No.: 575,617

[22] Filed: Aug. 31, 1990

[30] Foreign Application Priority Data

Sep. 13, 1989 [JP] Japan .................................. 1-238253

[51] Int. Cl.⁵ .............................................. H03F 3/16
[52] U.S. Cl. ..................................... 330/277; 330/306
[58] Field of Search ................. 330/178, 179, 277, 306

[56] References Cited

U.S. PATENT DOCUMENTS

| | | | |
|---|---|---|---|
| 2,202,361 | 5/1940 | Verbeek et al. | 330/179 X |
| 4,087,762 | 4/1978 | Ashley | 330/304 |
| 4,107,621 | 8/1978 | Furutani et al. | 330/296 |

FOREIGN PATENT DOCUMENTS 73911  6/1981  Japan .................. 330/277

OTHER PUBLICATIONS

K. Honjo et al., "GaAs FET Ultaboard-Band Amplifiers for Gbits/s Data Rate Systems", IEEE, 1981, Jul., Trans. on MTT.

R. Halladay et al., "Dual MMICs Deliver 1w at ku Band" Microwave Journal, 1987, Aug.

*Primary Examiner*—James B. Mullins

[57] ABSTRACT

A field effect transistor amplifer has a high gain in a plurality of microwave frequency bands. In a field effect transistor with the gate terminal and the drain terminal thereof connected to a matching circuit on the input side and a matching circuit on the output side, respectively, a resonance circuit which is composed of a series circuit including at least one second inductor and a capacitor and connected in parallel to a resistor, is connected between at least one of the gate terminal of the field effect transistor and the ground and between the drain terminal of the field effect transistor and the ground. When a series circuit including the first inductor, at least one second inductor and the capacitor is resonated and short-circuited, the gain at the resonance frequency is dropped and a gain in the range outside of the desired bands is suppressed. When a series circuit including at least one second inductor and the capacitor and connected to the resistor is resonated and short-circuited, the drop of the gain at the resonance frequency due to the resistor is suppressed. This thereby enables high gains to be obtained in the desired bands.

10 Claims, 5 Drawing Sheets

FIELD EFFECT TRANSISTOR AMPLIFIER

BACKGROUND OF THE INVENTION

1. Field of the Invention

The present invention relates to a field effect transistor amplifier which is used in a microwave band and which has high gains, especially in a plurality of bands which are separated from each other.

2. Description of the Related Art

FIG. 9 is a circuit diagram of a conventional field effect transistor (hereinunder referred to as "FET") amplifier described in, for example, "GaAs FET Ultrabroad-Band Amplifiers for Gbits/s Data Rate Systems" by K.HONJO et al, IEEE 1981, JULY Trans. on MTT-29. In FIG. 9, the reference numeral 1 represents an FET with the source terminal thereof grounded and having a gate terminal G, a source terminal S and a drain terminal D. The reference numerals 2 and 4 represent transmission lines which are connected in series to resistors 3 and 5, respectively, and provided between the gate terminal G of the FET 1 and the ground and between the drain terminal of the FET 1 and the ground, respectively. The reference numerals 6 and 7 represent matching circuits. One end of the matching circuit 6 is connected to the gate terminal G of the FET 1 and the other end to an input terminal 8, while one end of the matching circuit 7 is connected to the drain terminal D of the FET 1 and the other end to an output terminal 9.

The operation of the conventional FET amplifier will now be explained.

The values of the respective elements are selected so that the influence of the resistors 3, 5 is smaller than that of the transmission lines 2, 4 in a high-frequency band. Therefore, in a high-frequency band, impedance matching is carried out by using the transmission line 2 and the matching circuit 6 on the input side and by using the transmission line 4 and the matching circuit 7 on the output side. On the other hand, in a low-frequency band, it is possible to suppress the increase in the unnecessary gain of the amplifier by making the influence of the resistors 3, 5 larger than that of the transmission lines 2, 4. Thus, according to the FET amplifier, it is possible to obtain a flat gain in a wide band ranging from a low-frequency band to a high-frequency band.

However, it is necessary in the conventional FET amplifier to suppress the gain in a low-frequency band in order to obtain a flat gain in a wide band. For this purpose, it is necessary to provide the resistor 3 between the gate terminal G of the FET 1 and the ground in series with the transmission line 2. It is therefore impossible to completely disregard the influence of the resistor 3 in a high-frequency band, so that the gain is disadvantageously reduced. In addition, in order to obtain gains in two bands which are separated from each other by several octaves, since the gain is greatly reduced by the resistor 3 in the conventional FET amplifier so as to make the gain characteristic flat in a wide frequency band which covers the two bands, it is very difficult to obtain high gains only in the two desired bands.

SUMMARY OF THE INVENTION

Accordingly, it is an object of the present invention to eliminate the above-described problems in the related art and to provide an FET amplifier which enables desired gains to be obtained in a plurality of frequency bands which are separated from each other by, for example, several octaves.

To achieve this aim, an FET amplifier according to the present invention comprises: a field effect transistor with the source terminal thereof grounded; a matching circuit on the input side which is connected to the gate terminal of the field effect transistor; a matching circuit on the output side which is connected to the drain terminal of the field effect transistor; and a resonance circuit which is composed of a series circuit including a first inductor and a resistor and a series circuit including a second inductor and a capacitor and connected in parallel to the resistor and which is connected between at least one of the gate terminal of the field effect transistor and the ground and between the drain terminal of the field effect transistor and the ground; wherein the inductances of the first and the second inductors and the capacitance of the capacitor in the resonance circuit are set so that the resonance frequency of the series circuit which includes these inductors and the capacitor is equal to the frequency between two frequency bands having desired gains and the resonance frequency of the series circuit, which includes the second inductor and the capacitor, is equal to the frequency in the higher one of the two frequency bands.

The FET amplifier having the above-described structure can suppress the drop in the gain in a desired band due to the resistor by resonating and short-circuiting the series circuit of the second inductor and the capacitor which is connected in parallel to the resistor.

It is also possible to reduce the unnecessary gain in the range out of the desired bands by resonating and short-circuiting the series circuit which includes the first and the second inductors and the capacitor.

It is possible to provide a plurality (n−1) of series circuits of the second inductor and the capacitor which are connected in parallel to the resistor in correspondence with desired n frequency bands in each of which a high gain is to be obtained. By resonating and short-circuiting the series circuits in the respective desired frequency bands, it is possible to suppress the reduction in the gains due to the resistor in the desired frequency bands.

The above and other objects, features and advantages of the present invention will become clear from the following description of the preferred embodiments thereof, taken in conjunction with the accompanying drawings.

DESCRIPTION OF THE PREFERRED EMBODIMENTS

Figure 1:
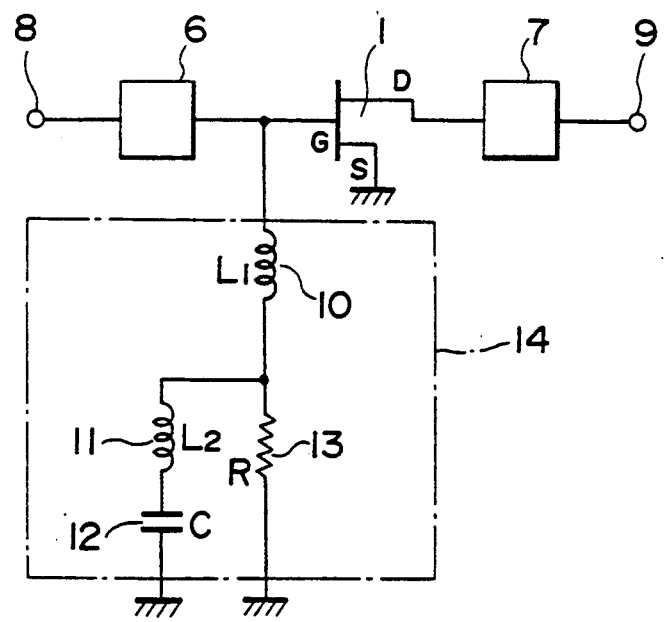
FIG. 1 is a circuit diagram of an embodiment of an FET amplifier according to the present invention.

An embodiment of the present invention will be explained hereinunder with reference to the accompanying drawings. In FIG. 1, the reference numeral 1 represents an FET with the source terminal thereof grounded and having a gate terminal G, the source terminal S and a drain terminal D. The reference numerals 6 and 7 represent matching circuits. One end of the matching circuit 6 is connected to the gate terminal G of the FET 1 and the other end to an input terminal 8, while one end of the matching circuit 7 is connected to the drain terminal D of the FET 1 and the other end to an output terminal 9. The reference numeral 10 denotes a first inductor having an inductance $L_1$. The first inductor is connected in series to a resistor 13 having a resistance R, and is disposed between the gate terminal G of the FET 1 and the ground. The reference numeral 11 denotes a second inductor having an inductance $L_2$. The second inductor 11 constitutes a series circuit together with a capacitor 12 having a capacitance C and is connected in parallel to the resistor 13. The circuit which is composed of the inductors 10, 11, the capacitor 12 and the resistor 13 will be referred to as "a resonance circuit 14" hereinunder.

The operation of this embodiment will now be explained. The resonance frequencies $f_1$, $f_2$ are obtained in the following way from the values of the elements of the resonance circuit 14 which is composed of the inductors 10, 11, the capacitor 12 and the resistor 13, and which is provided between the gate terminal G of the FET 1 and the ground:

$$f_1 = \frac{1}{2\pi \sqrt{(L_1 + L_2) \cdot C}} \quad (1)$$

$$f_2 = \frac{1}{2\pi \sqrt{L_2 \cdot C}} \quad (2)$$

wherein $f_1$ represents a frequency at which the series circuit including the inductors 10, 11 having the inductances $L_1$ and $L_2$, respectively and the capacitor 12 having the capacitance C resonates, whereby the circuit becomes a short-circuit, and $f_2$ represents a frequency at which the series circuit including the inductor 11 having the inductance $L_2$ and the capacitor 12 having the capacitance C resonates, whereby the circuit becomes a short-circuit.

In other words, when the resonance frequency is $f_1$, the resonance circuit 14 is approximately short-circuited, and the microwave, which is input from the input terminal 8, is substantially totally reflected and is not input to the FET 1. Thereby, almost no gain is obtained. When the resonance frequency is $f_2$, the inductor 11 having the inductance $L_2$ and the capacitor 12 having the capacitance C which are connected in parallel to the resistor 13 resonate in series, and are short-circuited. The influence of the resistance R is therefore negligible and the resonance circuit 14 substantially becomes a circuit where one end thereof is grounded having only the inductance $L_1$. At this time, by selecting the value of the respective elements so as to enable impedance matching by using the inductance $L_1$ and the matching circuit 6, the amplifier can obtain a high gain in the vicinity of $f_2$ almost without being influenced by the resistance R. Therefore, when there are two bands which are apart from each other, if $f_1$ is set at an intermediate frequency between the two bands and $f_2$ at the frequency in the higher-frequency band, the amplifier cannot obtain almost any gain in the vicinity of the intermediate band between the two bands, but can obtain high gains in the two desired bands which are separated from each other. The gain in the vicinity of the frequency $f_0$ of the lower-frequency band is determined by the resistor 13. Further, the matching circuit 6 can be made substantially coincident with the gain of the higher-frequency band, mainly by adjusting the resistance R.

Figure 2:
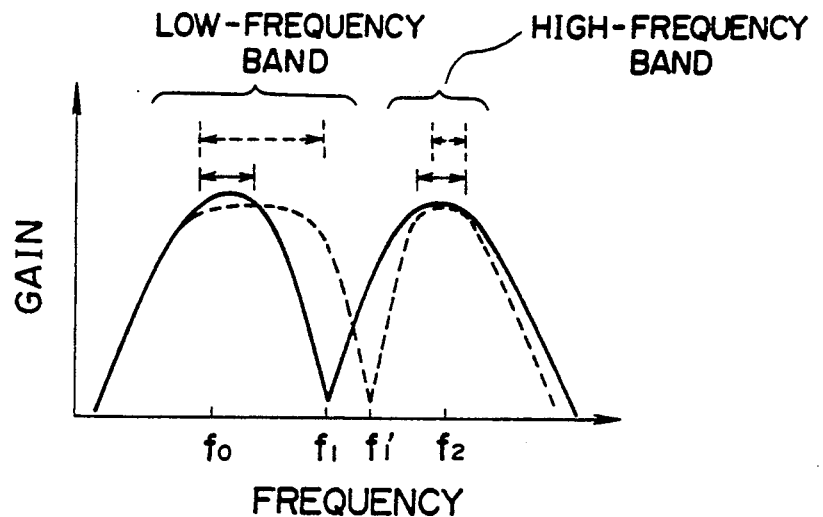
FIG. 2 is a frequency characteristic curve of the gain in the embodiment shown in FIG. 1.

FIG. 2 shows the frequency characteristic of the gain of the FET amplifier of this embodiment. As is clear from FIG. 2, it is possible to produce an amplifier having high gains in desired two bands by determining the values of the respective elements which constitute the resonance circuit 14 with respect to the desired frequencies $f_0$, $f_1$ and $f_2$. In order to adjust the band width in each band, the value of $f_1$ or $f_2$ is changed, as indicated by the broken line. For example, by changing $f_1$ into $f'_1$, it is possible to enlarge the band width of the lower-frequency band.

Figure 3:
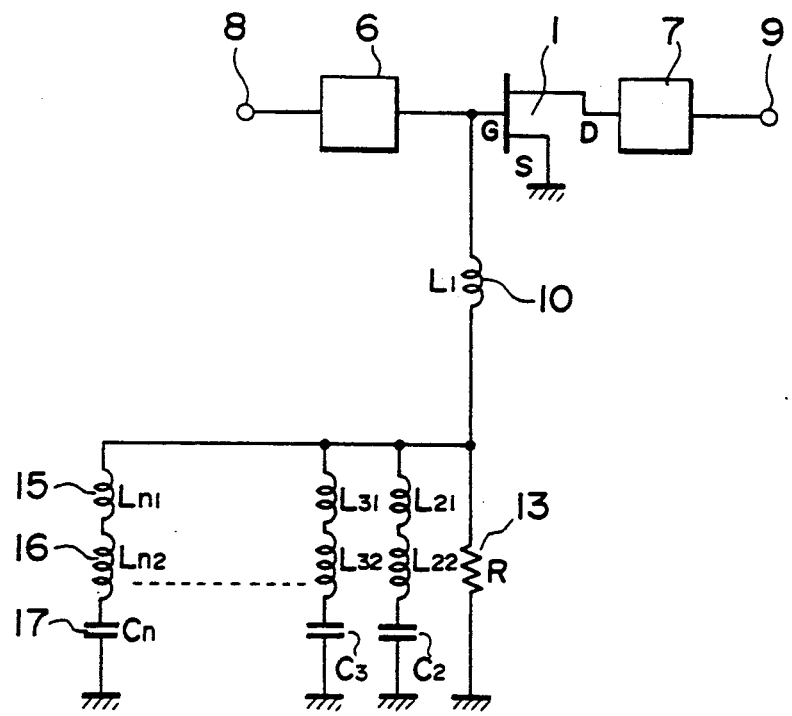
FIG. 3 is a circuit diagram of another embodiment of an FET amplifier according to the present invention.
Figure 4:
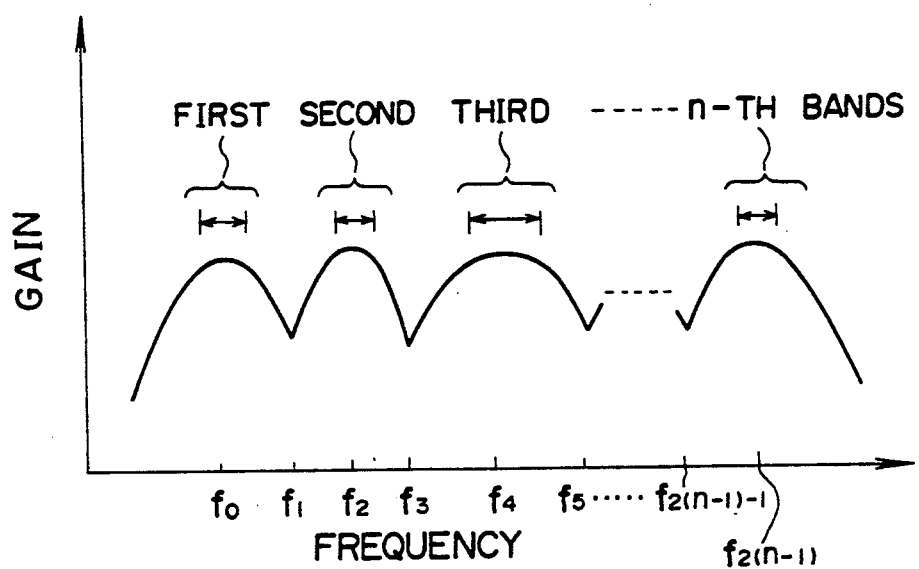
FIG. 4 is a frequency characteristic curve of the gain in the embodiment shown in FIG. 3.

In this embodiment, the FET amplifier has a two-peak characteristic and has high gains in the desired two bands. Generally, an n (n is an integer of not less than 2)-peak characteristic is obtained in the following manner. FIG. 3 is a circuit diagram of an FET amplifier having such an n-peak characteristic. In FIG. 3, $L_1$, $L_{n1}$ and $L_{n2}$ are the inductances of first, second and third inductors 10, 15, 16, respectively, $C_n$ the capacitance of a capacitor 17, and R the resistance of the resistor 13. (n−1) series circuits, each of which includes the inductors 15, 16 having the inductances $L_{n1}$ and $L_{n2}$ and the capacitor 17 having the capacitance $C_n$, are connected in parallel to the resistor 13.

In this structure, the series resonance frequency $f_{2(n-1)}$ including the inductance $L_{n2}$ and the capacitance $C_n$ and the series resonance frequency $f_{2(n-1)}$-1 including the inductances $L_1$, $L_{n1}$ and $L_{n2}$ and the capacitance $C_n$, are represented by the following formulae:

$$f_{2(n-1)-1} = \frac{1}{2\pi \sqrt{(L_1 + L_{n1} + L_{n2}) \cdot C_n}} \quad (3)$$

$$f_{2(n-1)} = \frac{1}{2\pi \sqrt{L_{n2} \cdot C_n}} \quad (4)$$

wherein n is an integer of not less than 2.

In a desired n-th band, the values of the respective elements of the resonance circuit 14 are selected so that the frequency $f_{2(n-1)}$ coincides with the frequency in the n-th band and the frequency $f_{2(n-1)}$ - 1 coincides with the frequency between the n-th band and the (n−1)th band. The inductance $L_{n1}$ is provided as an inductance to be adjusted for impedance matching between the inductor 10 and the matching circuit 6 and is set at an appropriate value in correspondence with the respective frequencies. In this way, one of the circuits connected in parallel to the resistor 13 is substantially short-circuited in each band, thereby enabling a high gain to be obtained without much influenced by the resistance R. The resonance circuit is approximately short-circuited between bands, thereby substantially cancelling the gain. In addition, it is possible to substantially equalize the gains of all the bands, including the first band, mainly by adjusting the resistance R and the inductance $L_{n1}$ to appropriate values. In this way, it is possible to produce an FET amplifier having an n-peak characteristic.

Figure 5:
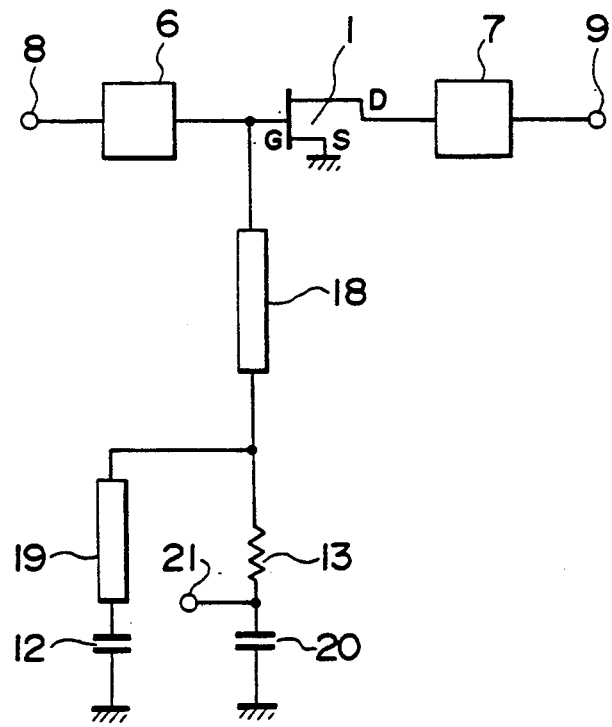
FIGS. 5, 6, 7 and 8 are circuit diagrams of other embodiments of an FET amplifier according to the present invention.

FIG. 5 is a circuit diagram of still another embodiment of an FET amplifier which is capable of obtaining high gains in two bands (n=2). In this embodiment, the two inductors 10, 11 shown in FIG. 1 are constituted by transmission lines 18, 19, respectively, having inductances within, and a capacitor 20 having a capacitance, the influence of which is negligible in two bands, is provided between the resistance 13 and the ground. This structure allows a gate bias of the FET 1 to be applied from a bias terminal 21.

Figure 6:
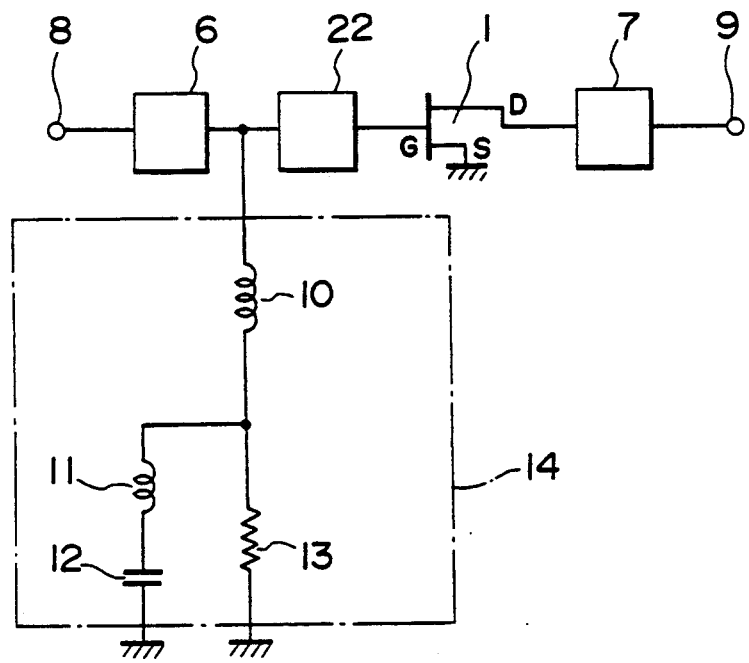

FIG. 6 is a circuit diagram of a further embodiment of an FET amplifier which has high gains in two bands. A matching circuit 22 is further provided between the gate terminal G of the FET 1 and the resonance circuit 14. This structure facilitates the impedance matching in the desired two bands.

Figure 7:
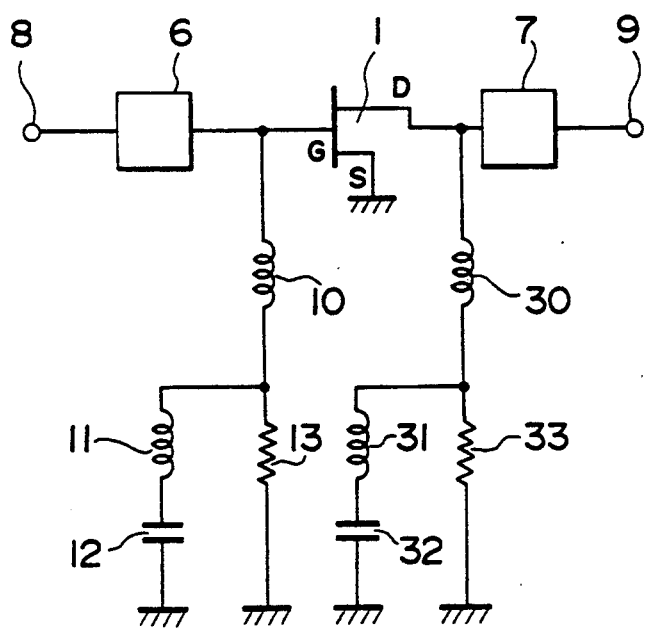

Although the resonance circuit is provided on the input side in the above-described embodiments, it is possible to connect resonance circuits to the input side and the output side, respectively, in the FET amplifier of the present invention FIG. 7 is a circuit diagram of such an embodiment. A resonance circuit composed of a series circuit including the first inductor 10 and the resistor 13 and a series circuit including the second inductor 11 and the capacitor 12 and connected in parallel to the resistor 13, is connected to the input side. Namely, it is connected inbetween the gate terminal and the ground. Apart from this, a resonance circuit composed of a series circuit including a first inductor 30 and a resistor 33 and a series circuit including a second inductor 31 and a capacitor 32 and connected in parallel to the resistor 33 is connected to the output side, namely, between the drain terminal and the ground.

Alternatively, an FET amplifier of the present invention may have a resonance circuit connected only to the output side.

Figure 8:
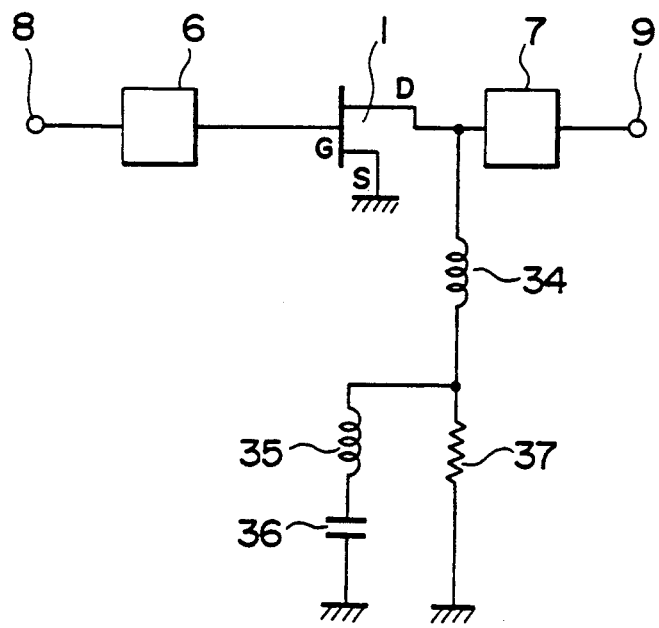
Figure 9:
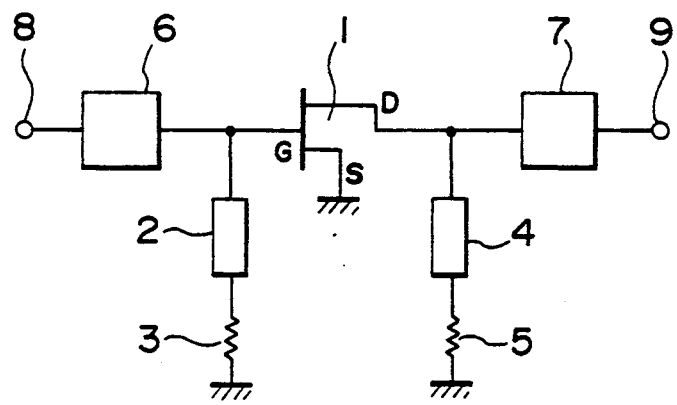
FIG. 9 is a circuit diagram of a conventional FET amplifier.

FIG. 8 is a circuit diagram of such an embodiment. A resonance circuit composed of a series circuit including a first inductor 34 and a resistor 37, and a series circuit including a second inductor 35 and a capacitor 36 and connected in parallel to the resistor 37, is connected to the output side, namely, between the drain terminal and the ground.

As described above, in these embodiments, a resonance circuit composed of a series circuit including a first inductor and a resistor and a series circuit including a second inductor and a capacitor and connected in parallel to the resistor is connected between at least one of the gate terminal of the field effect transistor with the source terminal thereof grounded and the ground and between the drain terminal of the field effect transistor and the ground. It is therefore possible to obtain predetermined gains in a plurality of microwave bands which are separated from each other by several octaves and to reduce the unnecessary gain in ranges other than these frequency bands.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A field effect transistor amplifier comprising:
    a field effect transistor with the source terminal thereof grounded;
    a matching circuit on an input side of the amplifier, which is connected to the gate terminal of said field effect transistor;
    a matching circuit on an output side of the amplifier, which is connected to the drain terminal of said field effect transistor;
    a plurality of resonance circuits, each of which is composed of a series circuit including a second inductor and a capacitor, connected in parallel to said resistor, at least one of said plurality of resonance circuits being connected between said gate terminal of said field effect transistor and ground, and at least one of said plurality of resonance circuits being connected between said drain terminal of said field effect transistor and ground.

2. A field effect transistor amplifier according to claim 1, wherein the inductances of said first and second inductors and the capacitance of said capacitor are set so that a resonance frequency, of a series circuit including said inductors and said capacitor, is equal to the frequency between two frequency bands which have predetermined desired gains, and the resonance frequency, of a series circuit including said second inductor and said capacitor, is equal to the frequency in a higher frequency band of said two frequency bands.

3. A field effect transistor amplifier according to claim 1, wherein (n-1), n being an integer greater than 1, series circuits, each of which includes said second inductor and said capacitor in said resonance circuit, are connected in parallel to said resistor in correspondence with n frequency bands having desired gains.

4. A field effect transistor amplifier according to claim 3, wherein the inductances, of said first inductor and said (n-1) second inductors and the capacitance of said (n-1) capacitors, are set so that respective resonance frequencies of said (n-1) series circuits are equal to the respective frequencies between the corresponding adjacent frequency bands of said n frequency bands which have predetermined desired gains, and the respective resonance frequencies of said (n-1) series circuits are equal to corresponding frequencies in said n frequency bands, except for the frequency of the lowest frequency band.

5. A field effect transistor amplifier comprising:
    a field effect transistor with the source terminal thereof grounded;
    a matching circuit on an input side of the amplifier, which is connected to the gate terminal of said field effect transistor;
    a matching circuit on an output side of the amplifier, which is connected to the drain terminal of said field effect transistor;
    a resonance circuit, which is composed of a series circuit including a first inductor and a resistor and a series circuit including a second inductor and a capacitor, connected in parallel to said resistor, connected between said gate terminal of said field effect transistor and ground.

6. A field effect transistor amplifier according to claim 5, wherein the inductances of said first and second inductors and the capacitance of said capacitor are set so that a resonance frequency, of a series circuit including said inductors and said capacitor, is equal to the frequency between two frequency bands which have predetermined desired gains, and the resonance frequency, of a series circuit including said second inductor and said capacitor, is equal to the frequency in a higher frequency band of said two frequency bands.

7. A field effect transistor amplifier according to claim 5, wherein (n−1), n being an integer greater than 1, series circuits, each of which includes said second inductor and said capacitor in said resonance circuit, are connected in parallel to said resistor in correspondence with n frequency bands having desired gains.

8. A field effect transistor amplifier according to claim 7, wherein the inductances, of said first inductor and said (n−1) series circuits are equal to the respective frequencies between the corresponding adjacent frequency bands of said n frequency bands which have predetermined desired gains, and the respective resonance frequencies of said (n−1) series circuits are equal to corresponding frequencies in said n frequency bands, except for the frequency of the lowest frequency band.

9. A field effect transistor amplifier comprising:
a field effect transistor with the source terminal thereof grounded;
a matching circuit on an input side of the amplifier, which is connected to the gate terminal of said field effect transistor;
a matching circuit on an output side of the amplifier, whichis connected to the drain terminal of said field effect transistor;
a resonance circuit, which is composed of a series circuit including a first inductor and a resistor and a series circuit including a second inductor and a capacitor, connected in parallel to said resistor, connected between said drain terminal of said field effect transistor and the ground.

10. A field effect transistor amplifier according to claim 9, wherein the inductances of said first and second inductors and the capacitance of said capacitor are set so that a resonance frequency, of a series circuit including said inductors and said capacitor, is equal to the frequency between two frequency bands which have predetermined desired gains, and the resonance frequency, of a series circuit including said second inductor and said capacitor, is equal to the frequency in a higher frequency band of said two frequency bands.

* * * * *